United States Patent
Lu

(10) Patent No.: US 11,862,237 B2
(45) Date of Patent: Jan. 2, 2024

(54) MEMORY AND METHOD FOR WRITING MEMORY

(71) Applicant: CHANGXIN MEMORY TECHNOLOGIES, INC., Hefei (CN)

(72) Inventor: Tianchen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 141 days.

(21) Appl. No.: 17/659,951

(22) Filed: Apr. 20, 2022

(65) Prior Publication Data

US 2023/0008991 A1 Jan. 12, 2023

Related U.S. Application Data

(63) Continuation of application No. PCT/CN2021/121684, filed on Sep. 29, 2021.

(30) Foreign Application Priority Data

Jul. 8, 2021 (CN) .......................... 202110773715.0

(51) Int. Cl.
*G11C 11/4094* (2006.01)
*G11C 11/4096* (2006.01)
(Continued)

(52) U.S. Cl.
CPC ...... *G11C 11/4096* (2013.01); *G11C 11/4085* (2013.01); *G11C 11/4094* (2013.01);
(Continued)

(58) Field of Classification Search
CPC ............ G11C 11/4096; G11C 11/4085; G11C 11/4094; G11C 8/12; G11C 7/18;
(Continued)

(56) References Cited

U.S. PATENT DOCUMENTS 4,567,578 A * 1/1986 Cohen ................. G11C 8/10
365/189.04
5,490,115 A 2/1996 Shah
(Continued)

FOREIGN PATENT DOCUMENTS

| CN | 1015031 B | 12/1991 |
| CN | 102169712 A | 8/2011 |
| CN | 112992201 A | 6/2021 |

OTHER PUBLICATIONS

"JEDEC Standard Low Power Double Data Rate 5 (LPDDR5) JESD209-5B(Revision of JESD209-5A, Jan. 2020) JEDEC Solid State Technology Association" Jun. 2021.

*Primary Examiner* — Khamdan N. Alrobaie
(74) *Attorney, Agent, or Firm* — Syncoda LLC; Feng Ma

(57) ABSTRACT

A memory includes a bank, the bank includes a plurality of sections, each of the plurality of section includes a plurality of word lines, a plurality of bit lines, and a plurality of storage units arranged in an array, and each of the plurality of storage units is connected to one of the plurality of word lines and one of the plurality of bit lines; the bank is configured to: in a preset mode, in response to a control signal, activate each of a plurality of word lines in at least one target section of the bank, pull up or pull down a level of each of a plurality of bit lines in the target section, and pull a complementary bit line of each of the plurality of bit lines in the target section to a level opposite to a level of the plurality of bit lines.

20 Claims, 7 Drawing Sheets

(51) Int. Cl.
*H03K 19/0185* (2006.01)
*H03K 19/017* (2006.01)
*G11C 11/408* (2006.01)

(52) U.S. Cl.
CPC .............. *H03K 19/01742* (2013.01); *H03K 19/018521* (2013.01)

(58) Field of Classification Search
CPC .............. G11C 11/4091; G11C 29/40; H03K 19/01742; H03K 19/018521
See application file for complete search history.

(56) References Cited

U.S. PATENT DOCUMENTS

| | | | |
|---|---|---|---|
| 5,517,451 A | | 5/1996 | Okuzawa |
| 6,130,847 A | | 10/2000 | Huang |
| 6,438,718 B1 | | 8/2002 | Cline |
| 2005/0052916 A1 | * | 3/2005 | Brox ................. G11C 11/40615 365/203 |
| 2009/0175098 A1 | * | 7/2009 | Park ................... G11C 11/4076 365/230.03 |
| 2010/0182819 A1 | * | 7/2010 | Matsufuji .............. G11C 17/16 365/96 |
| 2011/0211410 A1 | | 9/2011 | Kim |
| 2018/0218766 A1 | * | 8/2018 | Erickson ............ G11C 11/4094 |
| 2022/0051714 A1 | * | 2/2022 | Bang ................. G11C 16/3418 |
| 2022/0230677 A1 | * | 7/2022 | Yang .................. G11C 11/4096 |

\* cited by examiner

MEMORY AND METHOD FOR WRITING MEMORY

CROSS-REFERENCE TO RELATED APPLICATIONS

This is a continuation of International Application No. PCT/CN2021/121684 filed on Sep. 29, 2021, which claims priority to Chinese Patent Application No. 202110773715.0 filed on Jul. 8, 2021. The disclosures of these applications are hereby incorporated by reference in their entirety.

BACKGROUND

Memories are memory devices used for storing information in modern information technologies. The memories are generally classified into volatile memories and non-volatile memories.

Since the response speed and operating speed of a Dynamic Random Access Memory (DRAM) are usually very fast, the DRAM is widely used as a main memory or a buffer memory of a system. Generally, a DRAM chip can be market-oriented only when a series of tests are performed after production. During a testing stage, a DRAM storage matrix is mainly tested, which often requires rapid detection of the memory cells with errors, and then to repair the detected memory cells with errors. Therefore, how to quickly and accurately detect a defect in the storage unit has become an important research direction in the art.

SUMMARY

Embodiments of the disclosure relate to the field of integrated circuits, and in particular, to a memory and a method for writing a memory.

In view of the above, embodiments of the disclosure provide a memory and a method for writing the memory to solve at least one problem in the background.

To achieve the foregoing objectives, the technical solutions in the embodiments of the disclosure are implemented as follows.

The embodiments of the disclosure provide a memory, including:

a bank.

The bank includes a plurality of sections, each of the plurality of sections comprises a plurality of word lines, a plurality of bit lines, and a plurality of storage units arranged in an array, each of the plurality of storage units being connected to one of the plurality of word lines and one of the plurality of bit lines.

The bank is configured to: in a preset mode, in response to a control signal, activate each of a plurality of word lines in at least one target section of the bank, pull up or pull down a level of each of a plurality of bit lines in the target section, and pull a complementary bit line of each of the plurality of bit lines in the target section to a level opposite to a level of the plurality of bit lines, wherein the complementary bit line is a bit line in a section adjacent to the target section.

The embodiments of the disclosure further provide a compression writing method, including:

controlling a memory to enter a preset mode;
activating each of a plurality of word lines in at least one target section comprised in the memory; and
pulling up or pulling down a level of each of a plurality of bit lines in the target section, and pulling a complementary bit line of each of the plurality of bit lines in the target section to a level opposite to a level of the plurality of bit lines.

The memory includes a bank. The bank includes a plurality of sections, each of the plurality of sections includes a plurality of word lines, a plurality of bit lines, and a plurality of storage units arranged in an array, and each of the plurality of storage units is connected to one of the plurality of word lines and one of the plurality of bit lines, and the complementary bit line is a bit line in a section adjacent to the target section.

DETAILED DESCRIPTION

Figure 1:
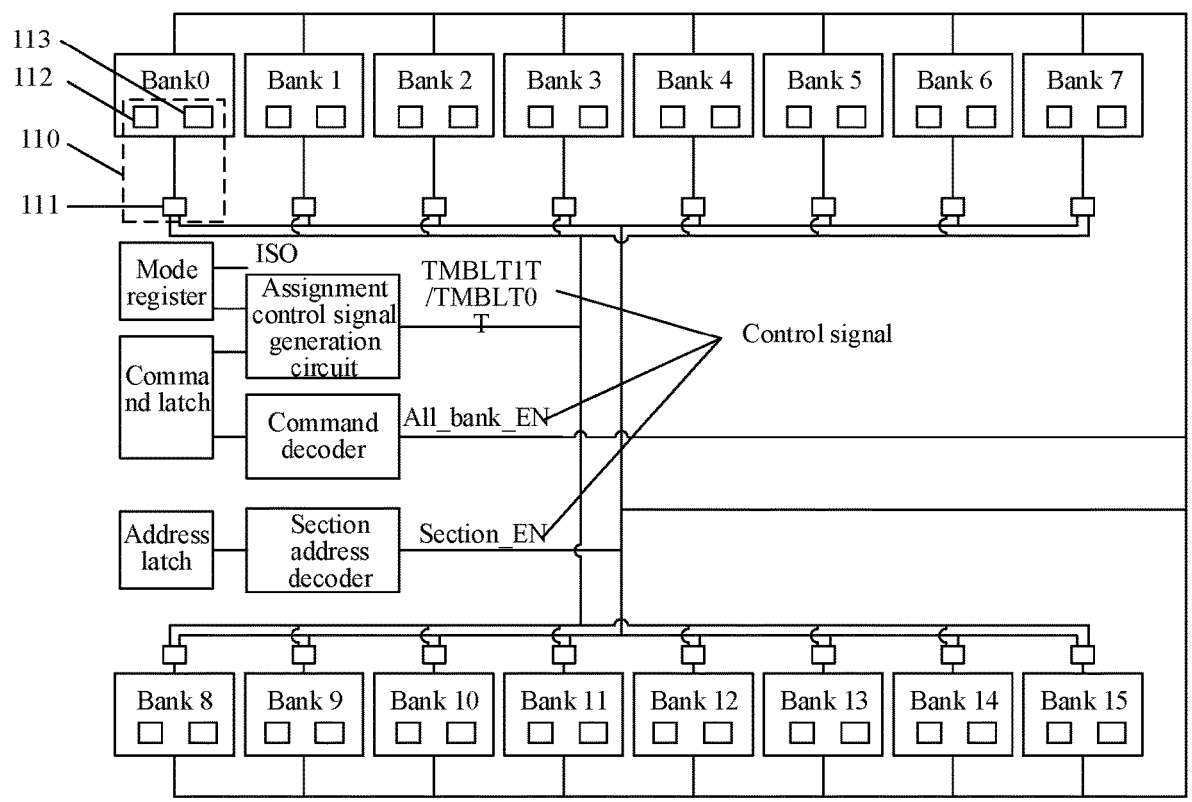
FIG. 1 is a schematic diagram of a circuit of a memory according to an embodiment of the disclosure.

Exemplary implementations disclosed in the embodiments of the disclosure will be described in more detail below with reference to the accompanying drawings. Although the exemplary implementations in the embodiments of the disclosure are shown in the accompanying drawings, it should be understood that the embodiments of the disclosure can be implemented in various forms without being limited by the specific implementations described herein. Instead, these implementations are provided in order to provide a more thorough understanding of the embodiments of the disclosure, and to enable the scopes of the embodiments of the disclosure to be comprehensively conveyed to those skilled in the art.

In the following descriptions, a large number of specific details are given to provide a more thorough understanding of the embodiments of the disclosure. However, it is apparent to those skilled in the art that the embodiments of the disclosure can be implemented without one or more of these details. In other examples, to avoid confusion with the embodiments of the disclosure, some well-known technical features in the art will not be described. That is, not all features of actual embodiments are described herein, and well-known functions and structures will not be described in detail.

In the drawings, dimensions of layers, regions, and elements, and their relative dimensions may be exaggerated for clarity. The same reference numerals in the full text represent the same elements.

It should be understood that when an element or layer is referred to be as being "above", "adjacent to", "connected with", or "coupled with" other elements or layers, the element or layer can be directly above, adjacent to, connected with, or coupled with the other elements or layers, or there may be intermediate elements or layers. Instead, when an element or layer is referred to be as being "directly above", "directly adjacent to", "directly connected with", or "directly coupled with" other elements or layers, there is not any intermediate element or layer. It should be understood that, although the terms of first, second, third and the like may be used to describe various elements, components, regions, layers, and/or parts; these elements, components, regions, layers, and/or parts shall not be limited by these terms. These terms are used only to distinguish one element, component, region, layer, or part from another element, component, region, layer, or part. Therefore, without departing from the teachings of the embodiments of the disclosure, a first element, component, region, layer, or part discussed below can be represented as a second element, component, region, layer, or part. However, when a second element, component, region, layer, or part is discussed, it does not indicate that a first element, component, region, layer, or part necessarily exists in the embodiments of the disclosure.

The spatial relationship terms of "below", "under", "down", "beneath", "above", "on", and the like may be used herein for convenience of description, so as to describe a relationship between one element/feature and another element/feature shown in the figures. It should be understood that, in addition to orientations shown in the figures, the spatial relationship terms are intended to further include different orientations of devices in use and operation. For example, if the device in the figures is reversed, elements or features "under" or "beneath" or "below" other elements or features will be oriented to "above" the other elements or features. Thus, the exemplary terms "under" and "below" may include two orientations: up and down. The device can be otherwise oriented (rotated by 90 degrees or other orientations) and the spatial descriptors used herein are interpreted accordingly.

The terms used herein are merely intended to describe specific embodiments and do not impose a limitation on the embodiments of the disclosure. For use herein, the singular forms "a", "one", and "the/said" are also intended to include the plural forms, unless another manner is clearly indicated in the context. It should also be understood that the terms "constitute" and/or "include", when used in this specification, determine the presence of stated features, integers, steps, operations, elements and/or components, but do not preclude the presence or addition of one or more other features, integers, steps, operations, elements, components and/or groups. For use herein, the term of "and/or" includes any and all combinations of the associated listed items.

The term "three-dimensional memory" used in the following descriptions refers to a semiconductor device having the following storage unit, and the storage unit is vertically arranged on a transversely oriented substrate, so that the number of storage units increases in a vertical direction relative to the substrate. As used herein, the term of "vertical/vertically" denotes being nominally perpendicular to a lateral surface of the substrate.

As described in the background, the DRAM chip can be market-oriented only when a series of tests are performed after production. In the foregoing series of tests, it is particularly important to detect and test a faulty storage unit in a memory. Generally, the steps for detecting the faulty storage unit in the memory are as the following: firstly, values are assigned to all storage units in the memory according to a predetermined rule, then a reading operation is performed on all the storage units in the memory, the read data is compared with the predetermined rule, and a storage unit that is inconsistent with storage data of the predetermined rule is detected as the faulty storage unit. Therefore, duration of a write operation will directly affect the test time and the test efficiency of the DRAM chip.

The test machine used in the testing stage is often not tested frequently due to the test items. In this case, if the write operation in a normal mode is performed during the testing stage, it will inevitably waste a lot of testing time and consume a lot of testing cost when performing the test after filling all storage matrices in the DRAM. In some implementations, a test designer will design a special test mode (or a compression mode) for a test department to achieve faster filling of the entire DRAM memory matrix for testing, and then the testing will be performed. However, in a compression writing mode in some implementations, a total of 32 word lines of 16 banks in the DRAM chip are operated at once, and only 2048-bit data can be written at once in an MPR write manner. Although the compression writing mode in some implementations is much faster than the normal mode, too much time will still be consumed, and a large number of test costs will be wasted.

Figure 2A:
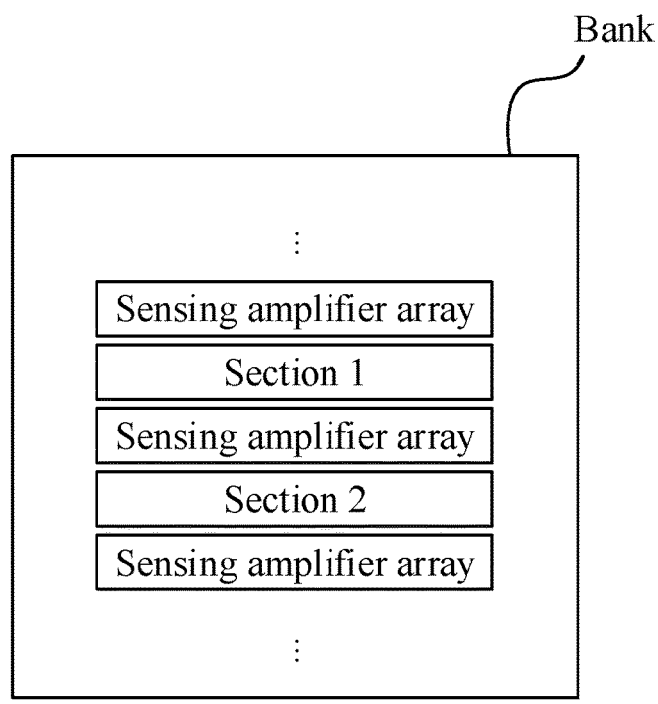
FIG. 2A is an enlarged schematic block diagram of a bank and an enlarged schematic circuit diagram of the bank according to embodiments of the disclosure.
Figure 2B:
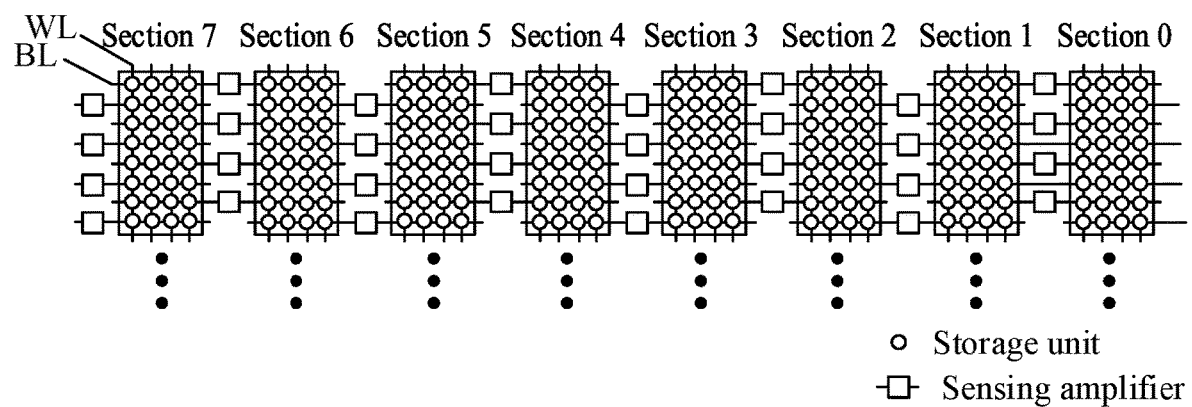
FIG. 2B is another enlarged schematic block diagram of a bank and an enlarged schematic circuit diagram of the bank according to embodiments of the disclosure.

Therefore, embodiments of the disclosure provide a memory. As shown in FIGS. 1, 2A, and 2B, the memory includes:

a bank.

The bank includes a plurality of sections, each of the plurality of sections includes a plurality of word lines, a plurality of bit lines, and a plurality of storage units arranged in an array, where each of the plurality of storage units is connected to one of the plurality of word lines and one of the plurality of bit lines.

The bank is configured to: in a preset mode, in response to a control signal, activate each of a plurality of word lines in at least one target section of the bank, pull up or pull down a level of each of a plurality of bit lines in the target section, and pull a complementary bit line of each of the plurality of bit lines in the target section to a level opposite to a level of the plurality of bit lines, where the complementary bit line is a bit line in a section adjacent to the target section.

In practical operations, there may be a plurality of banks. For example, as shown in FIG. 1, the memory includes 16 banks: bank 0, . . . , and bank 15. FIG. 2A is a schematic block diagram of the bank. As shown in FIG. 2A, due to a limitation of a capability of a sensing amplifier array, one sensing amplifier array may be required to be configured in a region formed by storage units within each hundreds of word lines (for example, 800 to 900 word lines), and the signals of a bit line and a complementary bit line included in the region may be amplified by using one sensing amplifier array. The foregoing storage units, word lines, and bit lines within each hundreds of word lines may constitute one section. FIG. 2B is an enlarged schematic circuit diagram of the bank. As shown in FIG. 2B, the section may include a plurality of Word Lines (WLs), a plurality of Bit Lines (BLs), and a plurality of storage units arranged in an array, and each of the plurality of storage units may be connected to one of the plurality of WLs and one of the plurality of BLs. In addition, a bit line in a section adjacent to each of the plurality of sections may be a complementary bit line of a bit line in the section, and a sensing amplifier may be connected between the bit line and the complementary bit line to amplify a signal between the bit line and the complementary bit line.

As shown in FIG. 1, the control signal may include a section enable signal Section-EN. The bank may be configured to: in the preset mode, in response to a control signal, activate each of a plurality of word lines in at least one target section of the bank; the operation may further include: activating, by the bank, each of the plurality of word lines in the target section based on the section enable signal Section-EN.

Specifically, referring to FIG. 1, the section enable signal Section-EN may be generated in the following manner: an address latch may send address information of the target section to a section address decoder, and the section address decoder may decode the address information of the section to generate the section enable signal Section-EN.

In an embodiment, the control signal may further include a bank enable signal Bank-EN (not shown in the figure), and the bank may be further configured to: when the bank enable signal Bank-EN is enabled, activate each of the plurality of word lines in the target section based on the section enable signal Section-EN; and when the bank enable signal Bank-EN is disabled, not activate a word line.

When the memory includes a plurality of banks, in a preset mode, multiple bank enable signals Bank-ENs of the plurality of banks may be enabled at the same time. That is, each of the plurality of word lines in a target bank in the plurality of banks can be activated in the preset mode. Here, the preset mode may be a compression writing mode.

Here, in order to enable each of the plurality of word lines in all banks to be activated, in an embodiment, as shown in FIG. 1, the control signal may further include an all-bank enable signal All-bank-EN. When the all-bank enable signal All-bank-EN is enabled, all the bank enable signals Bank-ENs may be enabled at the same time. In this case, each of the plurality of word lines in all of the banks may be activated. As shown in FIG. 1, the all-bank enable signal All-bank-EN may be generated in the following manner: a command latch may send a command signal to a command decoder, and the command decoder may decode the command signal to obtain the all-bank enable signal All-bank-EN.

To implement the overall assignment of the section, in addition to activating all word lines in the target section, it is also necessary to adjust the voltage of the bit line and the voltage of the complementary bit line to drive the voltage adjustment of the bit line, thereby implementing the assignment of the section.

Therefore, as shown in FIG. 1, the memory may further include a bit-line write control circuit 110. The bit-line write control circuit 110 may be configured to pull up or pull down a level of all the plurality of bit lines in the target section based on the control signal, and pull a complementary bit line of each of the plurality of bit lines in the target section to a level opposite to a level of the plurality of bit lines.

In an implementation, as shown in FIG. 1, the bit-line write control circuit 110 may include an enable circuit 111, a bit-line write circuit 112, and a complementary bit-line write circuit 113. The enable circuit 111 may be configured to generate a bit-line write control signal and a complementary bit-line write control signal based on the control signal, and respectively send the bit-line write control signal and the complementary bit-line write control signal to the bit-line write circuit 112 and the complementary bit-line write circuit 113. The bit-line write circuit 112 may be configured to pull the bit line to a high level or a low level based on the bit-line write control signal. The complementary bit line write circuit 113 may be configured to pull the complementary bit line to a level opposite to a level of the plurality of bit lines based on the complementary bit-line write control signal.

Figure 3:
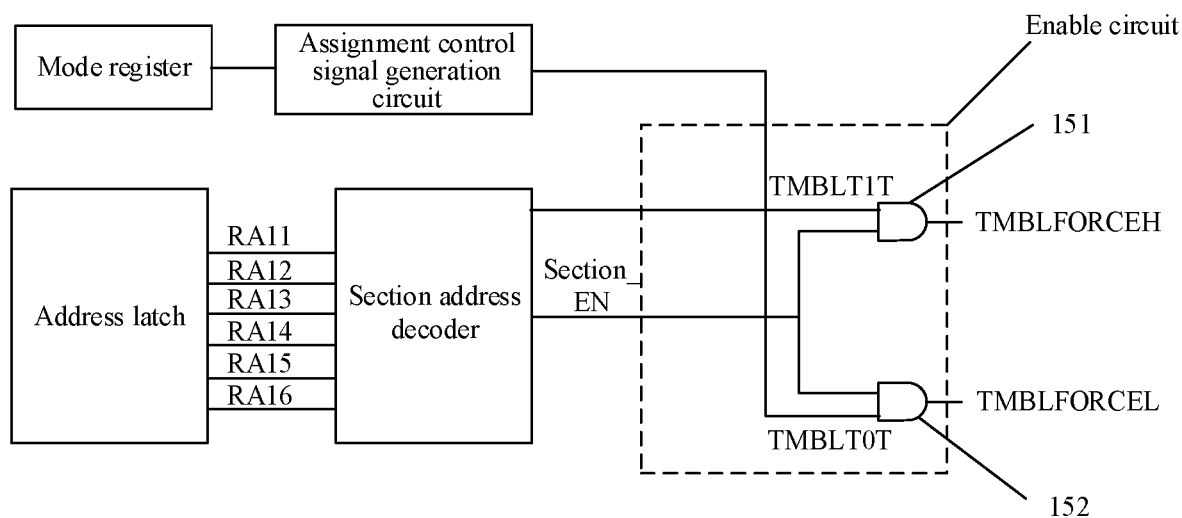
FIG. 3 is an enlarged schematic diagram of an enable circuit and a surrounding circuit of the enable circuit according to an embodiment of the disclosure.

Specifically, FIG. 3 is an enlarged schematic diagram of the enable circuit 111 and a surrounding circuit of the enable circuit 111. As shown in FIGS. 1 and 3, the control signal may further include a first trigger signal TMBLT1T and a second trigger signal TMBLT0T. The enable circuit 111 may include a first AND gate 151 and a second AND gate 152. The first AND gate 151 may be configured to obtain the first trigger signal TMBLT1T and the section enable signal Section-EN in the control signal, and generate the bit-line write control signal based on the first trigger signal TMBLT1T and the section enable signal Section-EN. The second AND gate 152 may be configured to obtain the second trigger signal TMBLT0T and the section enable signal Section-EN, and generate the complementary bit-line write control signal TMBLFORCEL based on the second trigger signal TMBLT0T and the section enable signal Section-EN. The bit-line write control signal TMBL-FORCEH and the complementary bit-line write control signal TMBLFORCEL may be a high write control signal or a low write control signal. Moreover, the first AND gate 151 and the second AND gate 152 may be configured to perform the following operations: the second AND gate 152 may output the low write control signal in response to the first AND gate 151 outputting the high write control signal; and the second AND gate 152 may output the high write control signal in response to the first AND gate 151 outputting the low write control signal.

Specifically, when the first trigger signal TMBLT1T is 1, the second trigger signal TMBLT0T will be 0; the first AND gate 151 may be configured to generate the high write control signal according to the first trigger signal TMBLT1T and the section enable signal Section-EN, and the second AND gate 152 may be configured to generate the low write control signal according to the second trigger signal TMBLT0T and the section enable signal Section-EN. The first trigger signal TMBLT1T and the second trigger signal TMBLT0T may be controlled to be opposite signals, so that the second AND gate 152 can output the low write control signal when the first AND gate 151 outputs the high write control signal, and the second AND gate 152 can output the high write control signal when the first AND gate 151 outputs the low write control signal.

Here, the first trigger signal TMBLT1T and the second trigger signal TMBLT0T may be generated by an assignment control signal generation circuit. Specifically, the assignment control signal generation circuit may be configured to obtain a preset mode signal from a mode register. When the preset mode is a compression write mode, the assignment control signal generation circuit may be driven by the preset mode signal to respectively send the first trigger signal TMBLT1T and the second trigger signal TMBLT0T to the first AND gate 151 and the second AND gate 152.

Figure 4:
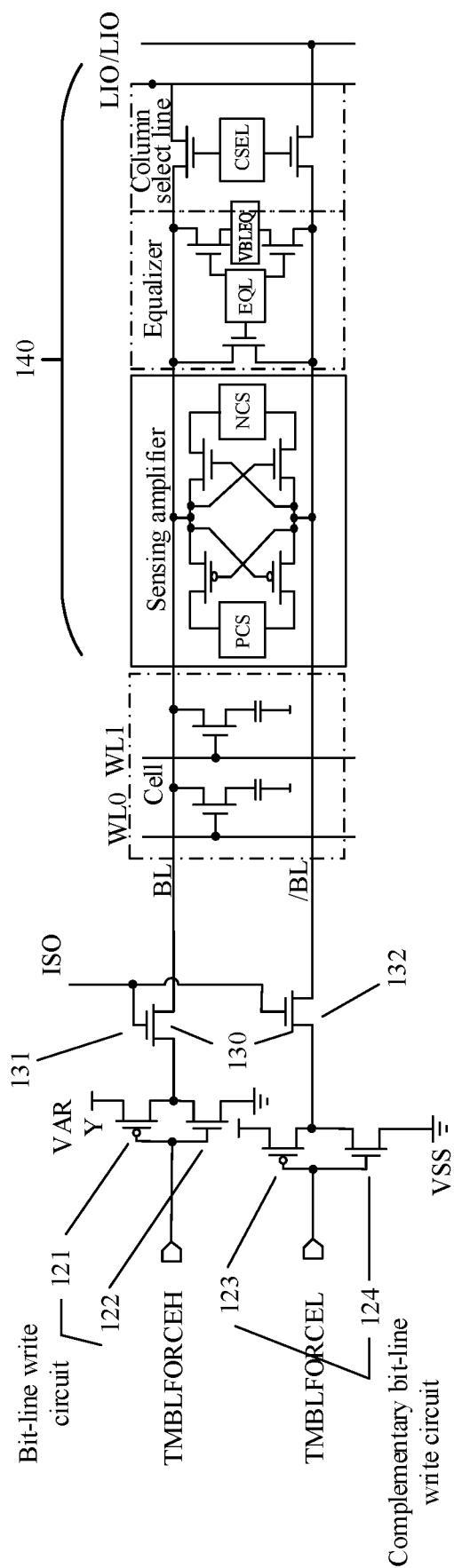
FIG. 4 is an enlarged schematic diagram of a bit-line write circuit and a complementary bit-line write circuit according to an embodiment of the disclosure.

FIG. 4 is an enlarged schematic diagram of the bit-line write circuit 112 and the complementary bit-line write circuit 113. As shown in FIG. 4, an input end of the bit line write circuit 112 may be connected to an output end of the first AND gate 151, and an input end of the complementary bit-line write circuit 113 may be connected to an output end of the second AND gate 152. The bit-line write circuit 112 may be configured to pull up or pull down a level of all the plurality of bit lines in the target section based on the bit-line write control signal. And the complementary bit-line write circuit 113 may be configured to pull the complementary bit-line in the target section to the level opposite to the level of the plurality of bit lines based on the complementary bit-line write control signal.

In an embodiment, as shown in FIG. 4, the bit-line write circuit 112 may include a first transistor 121 and a second transistor 122. The first transistor 121 may be turned on in response to the low write control signal, and the second transistor 122 may be turned on in response to the high write control signal. A source of the first transistor 121 may be coupled to a power terminal, a drain of the first transistor 121 may be coupled to a drain of the second transistor 122, a source of the second transistor 122 may be grounded, and a gate of the first transistor 121 may be connected to a gate of the second transistor 122 and may be coupled to the first AND gate 151. The complementary bit-line write circuit 113 may include a third transistor 123 and a fourth transistor 124. The third transistor 123 may be turned on in response to the low write control signal, and the fourth transistor 124 may be turned on in response to the high write control signal. A source of the third transistor 123 may be coupled to the power terminal, a drain of the third transistor 123 may be coupled to a drain of the fourth transistor 124, a source of the fourth transistor 124 may be grounded, and a gate of the third transistor 123 may be connected to a gate of the fourth transistor 124 and may be coupled to the second AND gate 152. When the first AND gate 151 outputs the high write control signal to the bit-line write circuit 112, and the second AND gate 152 outputs the low write control signal to the complementary bit-line write circuit 113, the second transistor 122 may be turned on and the third transistor 123 may also be turned on. Since the source of the second transistor 122 is grounded VSS, and the source of the third transistor 123 is coupled to the power terminal, a level of the bit line will be pulled down and a level of the complementary bit line will be pulled up. Conversely, when the first AND gate 151 outputs the low write control signal to the bit-line write circuit 112, and the second AND gate 152 outputs a high write control signal to the complementary bit-line write circuit 113, the level of the bit line will be pulled up, and the level of the complementary bit line will be pulled down.

In the foregoing embodiment, since each of the bit-line write circuit 112 and the complementary bit-line write circuit 113 includes two transistors of opposite types, in the bit-line write circuit 112 and the complementary bit-line write circuit 113, there will be one transistor that is certainly not be turned off completely. However, after the memory is tested for practical applications, a main application scenario may be a normal write mode in a non-compression write mode. The normal write mode needs to be implemented by using a normal write circuit 140 (refer to FIG. 4). However, since there will be one transistor that is certainly not be turned off completely in the bit-line write circuit 112 and the complementary bit-line write circuit 113, in the normal write mode, the voltage of the bit line or the voltage of the complementary bit line will pulled up or pulled down by the bit-line write circuit and the complementary bit-line write circuit from a normal voltage, thereby causing interference to a normal writing process. Therefore, in an embodiment, as shown in FIG. 4, the memory may be further provided with an isolation circuit 130. As shown in FIG. 4, the isolation circuit 130 may include a first switch transistor 131 connected between the plurality of bit lines and the bit-line write circuit 112, and a second switch transistor 132 connected between the complementary bit line and the complementary bit-line write circuit 113. A gate of the first switch transistor 131 may be connected to a gate of the second switch transistor 132 and may be coupled to an isolation signal terminal ISO of the mode register. In response to the preset mode being the compression write mode, the isolation signal terminal ISO may be configured to output a high-level signal to the first switch transistor 131 and the second switch transistor 132. And in response to the preset mode being not the compression write mode, the isolation signal terminal ISO may be configured to output a low-level signal to the first switch transistor 131 and the second switch transistor 132. That is, when the preset mode is the compression write mode, the isolation circuit 130 may be configured to turn on the first switch transistor 131 and the second switch transistor 132, and when the preset mode is not the compression write mode, the isolation circuit 130 may be configured to turn off the first switch transistor 131 and the second switch transistor 132. Specifically, the high level herein can be higher than a VDD, and the low level herein can be lower than 0 V. The isolation signal can be output from the mode register, or the isolation signal can also be obtained by decoding from a command signal.

In this way, by arranging the isolation circuit 130, in the non-compression mode, the bit line and the complementary bit line can be disconnected from the bit-line write circuit 112 and the complementary bit-line write circuit 113 by controlling the isolation circuit 130. Even if there are transistors that cannot be turned off in the bit-line write circuit 112 and the complementary bit-line write circuit 113, since the bit line and the complementary bit line are disconnected from the bit-line write circuit 112 and the complementary bit-line write circuit 113, the normal writing process will not be interfered by the bit-line write circuit and the complementary bit-line write circuit.

Figure 5:
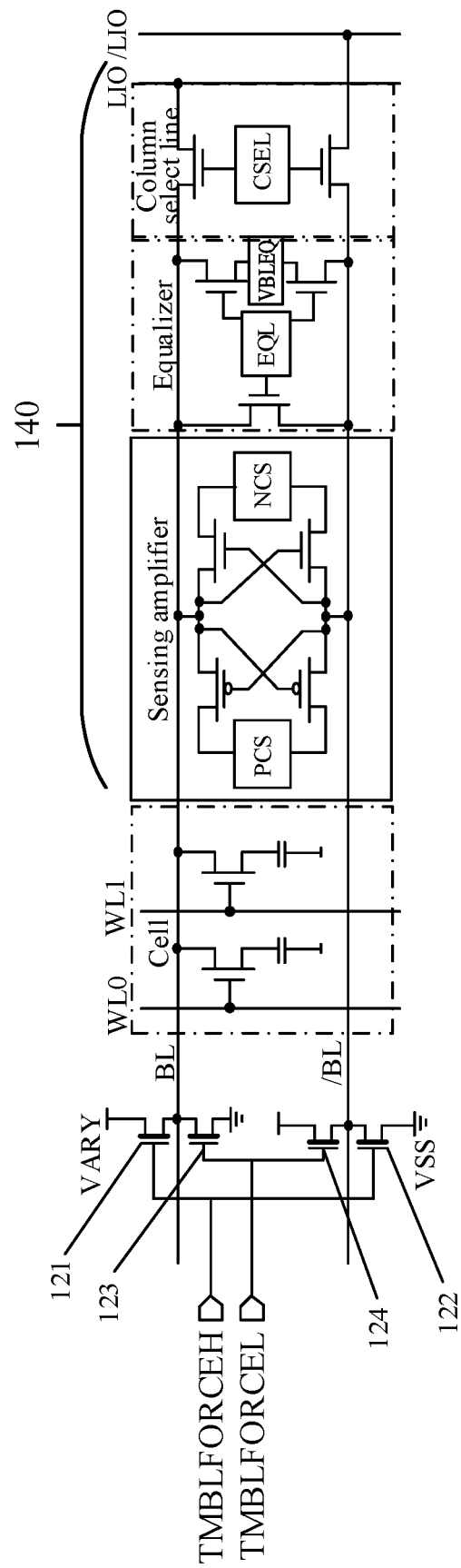
FIG. 5 is an enlarged schematic diagram of a bit-line write circuit and a complementary bit-line write circuit according to another embodiment of the disclosure.

In another embodiment, the bit-line write circuit 112 and the complementary bit-line write circuit 113 may have another structure shown in FIG. 5. As shown in FIG. 5, the bit-line write circuit 112 may include: the first transistor 121 and the second transistor 122 which may be turned on in response to the low write control signal. A source of the first transistor 121 may be coupled to a power terminal, a drain of the first transistor 121 may be coupled to the bit line, a source of the second transistor 122 may be coupled to the complementary bit line, a drain of the second transistor 122 may be grounded, and a gate of the first transistor 121 may be connected to a gate of the second transistor 122 and may be coupled to the first AND gate 151. Alternatively, the first transistor 121 and the second transistor 122 may be turned on in response to the high write control signal, a drain of the first transistor 121 may be coupled to a power terminal, a source of the first transistor 121 may be coupled to the bit line, a drain of the second transistor 122 may be coupled to the complementary bit line, a source of the second transistor 122 may be grounded, and a gate of the first transistor 121 may be connected to a gate of the second transistor 122 and may be coupled to the first AND gate 151.

Correspondingly, the complementary bit-line write circuit 113 may include: the third transistor 123 and the fourth transistor 124 which may be turned on in response to the low write control signal. A source of the third transistor 123 may be coupled to the bit line, a drain of the third transistor 123 may be grounded, a source of the fourth transistor 124 may be coupled to a power terminal, a drain of the fourth transistor 124 may be coupled to the complementary bit line, and a gate of the third transistor 123 may be connected to a gate of the fourth transistor 124 and may be coupled to the second AND gate 152.

Alternatively, the third transistor 123 and the fourth transistor 124 may be turned on in response to the high write control signal, a drain of the third transistor 123 may be coupled to the bit line, a source of the third transistor 123 may be grounded, a drain of the fourth transistor 124 may be coupled to a power terminal, a source of the fourth transistor 124 may be coupled to the complementary bit line, and a gate of the third transistor 123 may be connected to a gate of the fourth transistor 124 and may be coupled to the second AND gate 152.

The following uses an example in which the first transistor 121, the second transistor 122, the third transistor 123, and the fourth transistor 124 are all turned on in response to the low write control signal. When the first AND gate 151 outputs the high write control signal to the bit-line write circuit 112, and the second AND gate 152 outputs the low write control signal to the complementary bit-line write circuit 113, the third transistor 123 and the fourth transistor 124 may be turned on. Since the drain of the third transistor 123 is grounded, and the source of the fourth transistor 124 is coupled to the power terminal, the bit line will be pulled to the low level, and the complementary bit line will be pulled to the high level. Conversely, when the first AND gate 151 outputs the low write control signal to the bit-line write circuit 112, and the second AND gate 152 outputs the high write control signal to the complementary bit-line write circuit 113, the bit line will be pulled to the high level, and the complementary bit line will be pulled to the low level.

Figure 6:
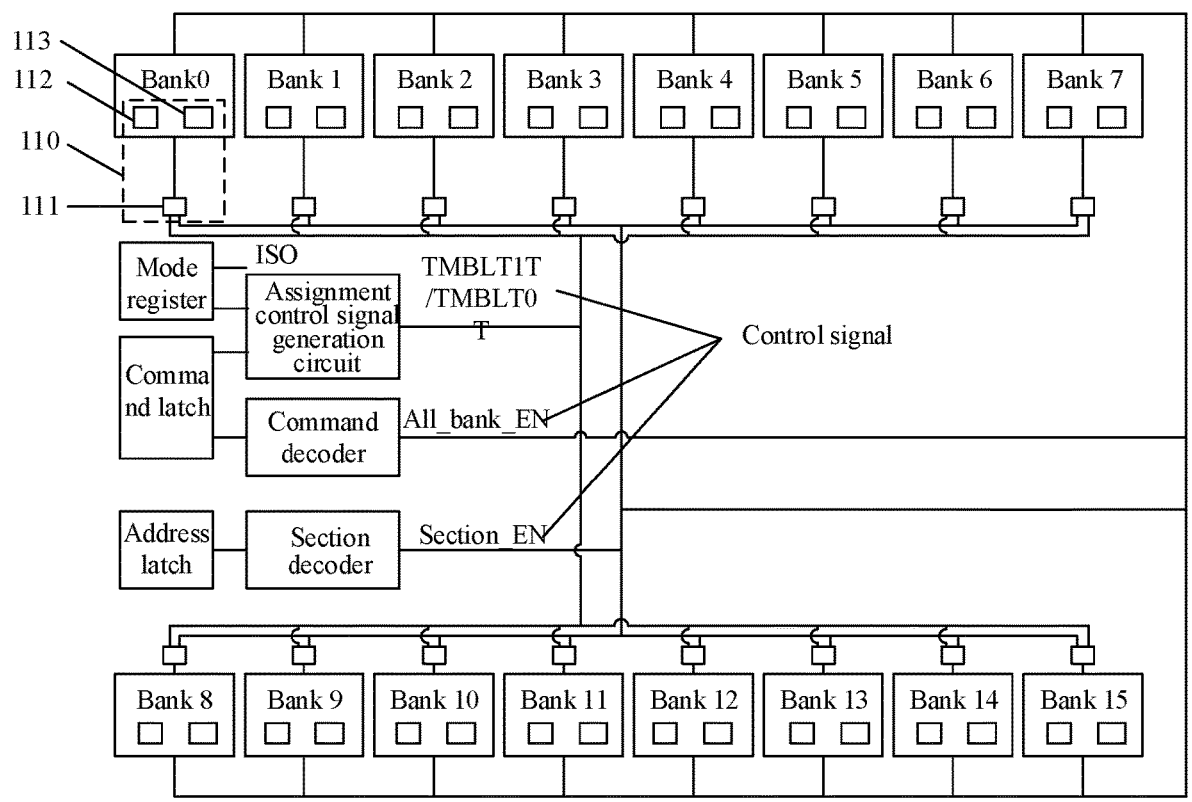
FIG. 6 is a schematic diagram of a circuit according to another embodiment of the disclosure.

In the implementation, the first transistor 121, the second transistor 122, the third transistor 123, and the fourth transistor 124 may be transistors of a same type. By applying a turn-off signal to the bit-line write circuit 112 and the complementary bit-line write circuit 113, the first transistor 121, the second transistor 122, the third transistor 123, and the fourth transistor 124 can be turned off. Therefore, for the bit-line write circuit 112 and the complementary bit-line write circuit 113 in the implementation, the turn-off signal may be applied to turn off all transistors in the bit-line write circuit 112 and the complementary bit-line write circuit 113, thereby avoiding interference to the normal writing process in the non-compression write mode. Therefore, in the implementation, as shown in FIGS. 5 and 6, the isolation circuit and the isolation signal terminal ISO do not need to be arranged in the memory. It should be understood that it is not specified herein that when the bit-line write circuit and the complementary bit-line write circuit apply the structure shown in FIG. 5, the isolation circuit 130 and the isolation signal terminal ISO may certainly not be arranged in the memory. Actually, to maximize isolation of interference, even if the bit-line write circuit and the complementary bit-line write circuit apply the structure shown in FIG. 5, the isolation circuit and the isolation signal terminal may also be arranged in the memory.

Figure 7:
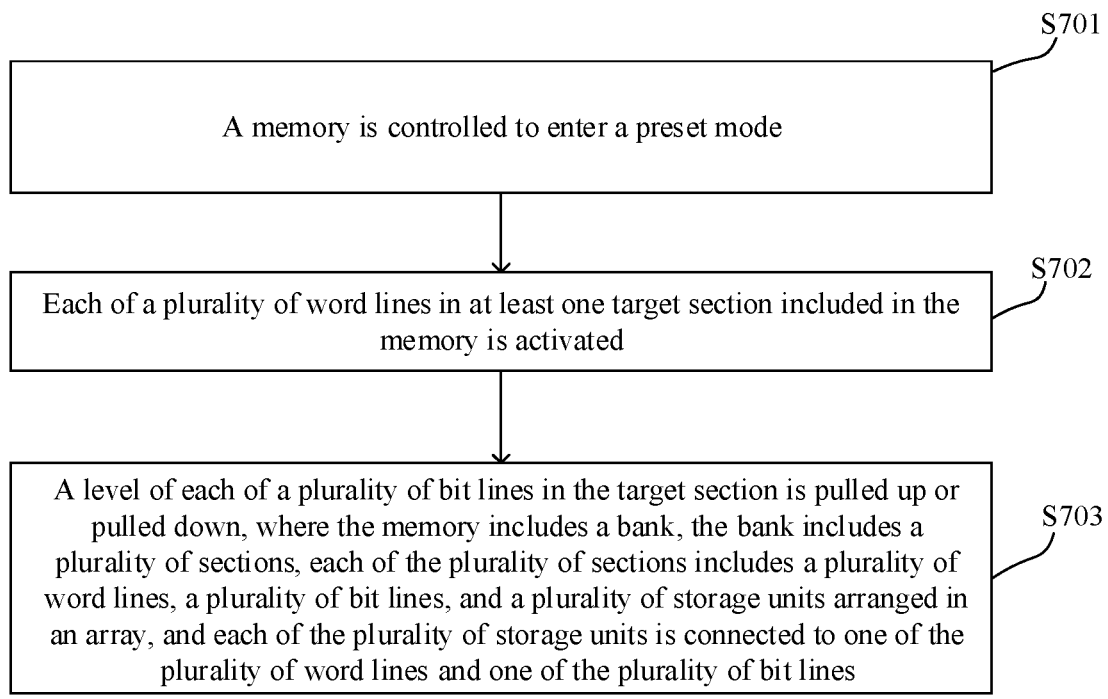
FIG. 7 is a schematic flowchart of a compression writing method according to embodiments of the disclosure.

Embodiments of the disclosure provide a compression writing method. As shown in FIG. 7, the method includes the following steps.

In a step of S701, a memory is controlled to enter a preset mode.

In a step of S702, each of a plurality of word lines in at least one target section included in the memory is activated.

In a step of S703, a level of each of a plurality of bit lines in the target section is pulled up or pulled down, and a complementary bit line of each of the plurality of bit lines in the target section is pulled to a level opposite to a level of the plurality of bit lines.

The memory includes a bank. The bank includes a plurality of sections, each of the plurality of sections includes a plurality of word lines, a plurality of bit lines, and a plurality of storage units arranged in an array, where each of the plurality of storage units is connected to one of the plurality of word lines and one of the plurality of bit lines, and the complementary bit line is a bit line in a section adjacent to the target section.

In practical operations, firstly, the step of S701 may be performed to control the memory to enter the preset mode. The preset mode can be a compression writing mode.

Then, the step of S702 may be performed to activate each of a plurality of word lines in the at least one target section included in the memory.

In an embodiment, the step of activating each of the plurality of word lines in at least one target section included in the memory may include the following operations.

A control signal may be received, where the control signal may include a section enable signal Section-EN.

And each of the plurality of word lines in the target section may be activated based on the section enable signal Section-EN.

Specifically, a section decoder may obtain address information from an address latch and decode the address information to obtain a section enable signal Section-EN, and then send the section enable signal Section-EN to the bank. The bank may receive the section enable signal Section-EN and activate each of the plurality of word lines in the target section.

In some embodiments, as shown in FIG. 1, the memory may include a plurality of banks.

The control signal may further include a bank enable signal Bank-EN (not shown in the figure).

When the bank enable signal Bank-EN is enabled, each of the plurality of word lines in the target section may be activated based on the section enable signal Section-EN; and when the bank enable signal Bank-EN is disabled, no word line may be activated.

In the preset mode, a plurality of bank enable signals Bank-ENs of the plurality of banks may be enabled at the same time. That is, each of the plurality of word lines in a target bank in the plurality of banks can be activated in the preset mode. Specifically, the preset mode can be, for example, a compression writing mode.

Here, in order to enable each of the plurality of word lines in all banks to be activated, in an embodiment, as shown in FIG. 1, the control signal may further include all bank enable signals All-bank-ENs. When all the bank enable signals All-bank-ENs are enabled, all the bank enable signals Bank-EN may be enabled at the same time. In this case, each of the plurality of word lines in all the banks may be activated. As shown in FIG. 1, all the bank enable signals All-bank-ENs may be generated in the following manner: a command latch may send a command signal to a command decoder, and the command decoder may decode the command signal to obtain all the bank enable signals All-bank-ENs.

After all the plurality of word lines in the target section are activated, a level of all the plurality of bit lines in the target section and a levels of the complementary bit lines of the plurality of bit lines need to be activated and changed, to further change the plate voltages on all storage units in the target section, thereby completing the assignment of the entire target section. That is, the step of S703 may be performed to pull up or pull down a level of the plurality of bit lines in the target section, and pull a complementary bit line of each bit line in the target section to a level opposite to a level of the plurality of bit lines.

In practical operations, the steps of pulling up or pulling down the level of the plurality of bit lines in the target section may include the following operations.

The section enable signal Section-EN may be obtained.

A bit-line write control signal TMBLFORCEH may be obtained, and the bit-line write control signal TMBLFORCEH may be a high write control signal or a low write control signal.

And the level of the plurality of bit lines may be pulled up or pulled down based on the bit-line write control signal TMBLFORCEH.

The steps of pulling the complementary bit line to the level opposite to the level of the plurality of bit lines may include the following operations.

The section enable signal Section-EN may be obtained.

A complementary bit-line write control signal TMBLFORCEL may be output, and the complementary bit-line write control signal TMBLFORCEL may be a high write control signal or a low write control signal.

The complementary bit line may be pulled to the level opposite to the level of the plurality of bit lines based on the complementary bit-line write control signal TMBLFORCEL.

Specifically, a mode register may send a preset mode signal to an assignment control signal generation circuit. When the preset mode is the compression writing mode, the preset mode signal may drive the assignment control signal generation circuit to respectively send a first trigger signal TMBLT1T and a second trigger signal TMBLT0T to a first AND gate 151 and a second AND gate 152. The first AND gate 151 may receive the section enable signal Section-EN and the first trigger signal TMBLT1T. The first trigger signal TMBLT1T may trigger the first AND gate to generate the bit-line write control signal TMBLFORCEH based on the section enable signal Section-EN and the first trigger signal TMBLT1T. The second AND gate 152 may receive the section enable signal Section-EN and the second trigger signal TMBLT0T. The second trigger signal TMBLT0T may trigger the second AND gate 152 to generate the complementary bit-line write control signal TMBLFORCEL based on the section enable signal Section-EN and the second trigger signal TMBLT0T.

The bit-line write control signal and the complementary bit-line write control signal can be a high write control signal or a low write control signal. Moreover, the first AND gate 151 and the second AND gate 152 may be configured to perform the following operations. The second AND gate 152 may output the low write control signal when the first AND gate 151 outputs the high write control signal; and the second AND gate 152 may output the high write control signal when the first AND gate 151 outputs the low write control signal.

Specifically, when the first trigger signal TMBLT1T is 1, the second trigger signal TMBLT0T may be 0, the first AND gate 151 may generate the high write control signal according to the first trigger signal TMBLT1T and the section enable signal Section-EN, and the second AND gate 152 may generate the low write control signal according to the second trigger signal TMBLT0T and the section enable signal Section-EN. The first trigger signal TMBLT1T and the second trigger signal TMBLT0T may be controlled to be opposite signals, so that the second AND gate 152 can output the low write control signal when the first AND gate 151 outputs the high write control signal, and the second AND gate 152 can output the high write control signal when the first AND gate 151 outputs the low write control signal.

The bit-line write control signal TMBLFORCEH may be received by the bit-line write circuit, and the complementary bit-line write control signal TMBLFORCEL may be received by the complementary bit-line write circuit. The bit-line write circuit may pull up or pull down the level of the plurality of bit lines based on the bit-line write control signal TMBLFORCEH, and the complementary bit-line write circuit may pull the level of the complementary bit line to be opposite to the level of the plurality of bit lines based on the complementary bit-line write control signal TMBLFORCEL.

Through the foregoing steps, in the implementations provided in the embodiments of the disclosure, all the plurality of word lines in the target section may be activated, and the writing manners of the voltage of the bit line and the voltage of a complementary bit line in the entire target section can be adjusted, so that the entire section can be assigned at once. In comparison with a normal writing mode and a general compression writing mode, the test time can be greatly shortened, the test efficiency can be improved, and the test costs can be reduced. In addition, a bit-line write control circuit provided in the embodiments of the disclosure may adjust the voltages of the bit line and the complementary bit line. In comparison with the normal writing mode and the general compression writing mode, the entire target section can be assigned without using a Column Select (CSEL) circuit, without requiring a local data line (LIO) to provide data, and without requiring to wait for a time sequence of tRCD and CWL, thereby further reducing the test time and the test costs.

Writing all matrices in one bank by using a writing mode in some implementations requires at least 65536 ACT PRECHARGE commands and 65536×128 write commands, and it is required to wait for the time for an inserted time sequence. However, in the compression writing mode in the embodiments of the discourse, only one ACT PRECHARGE and commands of all sections in one bank are required to write all storage matrices in one bank, and the time for some related test mode commands is required, thereby greatly reducing time required for assigning the storage matrices, improving the test efficiency, and reducing the test costs.

It should be noted that the embodiment of the three-dimensional phase change memory provided in embodiments of the disclosure and the embodiment of the method for preparing the three-dimensional phase change memory belong to a same concept. The technical features in the technical solutions described in the embodiments may be randomly combined without conflict.

The foregoing descriptions are merely preferred embodiments of the embodiments of the disclosure, but are not intended to limit the scope of protection of the embodiments of the disclosure. Any modifications, equivalent replacements, improvements, etc. made within the spirit and principle of the embodiments of the disclosure should be included within the scope of protection of the embodiments of the disclosure.

In the implementations provided in the embodiments of the disclosure, all the plurality of word lines in the target section may be activated, and the writing manners of the voltage of the bit line and the voltage of the complementary bit line in the entire target section can be adjusted, so that the entire section can be assigned at once. In comparison with the normal writing mode and the general compression writing mode, the test time can be greatly shortened, the test efficiency can be improved, and the test costs can be reduced. In addition, the bit-line write control circuit provided in the embodiments of the disclosure may adjust the voltages of the bit line and the complementary bit line. In comparison with the normal writing mode and the general compression writing mode, the entire target section can be assigned without using a Column Select (CSEL) circuit, without requiring a local data line (LIO) to provide data, and without requiring to wait for a time sequence of tRCD and CWL, thereby further reducing the test time and the test costs.

What is claimed is:

1. A memory, comprising:
a bank, wherein
the bank comprises a plurality of sections, each of the plurality of sections comprises a plurality of word lines, a plurality of bit lines, and a plurality of storage units arranged in an array, each of the plurality of storage units being connected to one of the plurality of word lines and one of the plurality of bit lines; and
the bank is configured to: in a preset mode, in response to a control signal, activate each of a plurality of word lines in at least one target section of the bank, pull up or pull down a level of each of a plurality of bit lines in the target section, and pull a complementary bit line of each of the plurality of bit lines in the target section to a level opposite to a level of the plurality of bit lines, wherein the complementary bit line is a bit line in a section adjacent to the target section.

2. The memory of claim 1, wherein the memory further comprises a bit-line write control circuit; wherein the bit-line write control circuit is configured to pull up or pull down a level of all the plurality of bit lines in the target section based on the control signal.

3. The memory of claim 2, wherein the bit-line write control circuit comprises an enable circuit and a bit-line write circuit; wherein the enable circuit is configured to: output a bit-line write control signal to the bit-line write circuit, the bit-line write control signal being a high write control signal or a low write control signal, and wherein the bit-line write circuit is configured to pull the bit line to a high level or a low level based on the bit-line write control signal.

4. The memory of claim 3, wherein the enable circuit comprises a first AND gate; wherein the first AND gate is configured to output the bit-line write control signal based on a section enable signal.

5. The memory of claim 4, wherein the bit-line write circuit comprises a first transistor and a second transistor;
wherein the first transistor is turned on in response to the low write control signal, and the second transistor is turned on in response to the high write control signal, and wherein a source of the first transistor is coupled to a power terminal, a drain of the first transistor is coupled to a drain of the second transistor, a source of the second transistor is grounded, and a gate of the first transistor is connected to a gate of the second transistor and is coupled to the first AND gate; or
wherein the first transistor and the second transistor are turned on in response to the low write control signal, and wherein the source of the first transistor is coupled to the power terminal, the drain of the first transistor is coupled to the plurality of bit lines, the source of the second transistor is coupled to the complementary bit line, the drain of the second transistor is grounded, and the gate of the first transistor is connected to the gate of the second transistor and is coupled to the first AND gate; or
wherein the first transistor and the second transistor are turned on in response to the high write control signal, and wherein the drain of the first transistor is coupled to the power terminal, the source of the first transistor is coupled to the plurality of bit lines, the drain of the second transistor is coupled to the complementary bit line, the source of the second transistor is grounded, and the gate of the first transistor is connected to the gate of the second transistor and is coupled to the first AND gate.

6. The memory of claim 4, wherein the bit-line write control circuit further comprises a complementary bit-line write circuit; wherein the complementary bit-line write circuit is configured to pull the complementary bit line to the level opposite to the level of the plurality of bit lines in the target section.

7. The memory of claim 6, wherein the enable circuit further comprises a second AND gate; wherein the second AND gate is configured to output a complementary bit-line write control signal to the complementary bit-line write circuit based on the control signal, the complementary bit-line write control signal being a high write control signal or a low write control signal; and wherein the complementary bit-line write circuit is configured to pull the complementary bit line to a high level or a low level based on the complementary bit-line write control signal.

8. The memory of claim 7, wherein the second AND gate is configured to output the low write control signal, in response to the first AND gate outputting the high write control signal, and wherein the first AND gate is configured to output the high write control signal, in response to the second AND gate outputting the low write control signal.

9. The memory of claim 8, wherein the complementary bit-line write circuit comprises a third transistor and a fourth transistor;
wherein the third transistor is turned on in response to the low write control signal, and the fourth transistor is turned on in response to the high write control signal, and wherein a source of the third transistor is coupled to a power terminal, a drain of the third transistor is coupled to a drain of the fourth transistor, a source of the fourth transistor is grounded, and a gate of the third transistor is connected to a gate of the fourth transistor and is coupled to the second AND gate; or
wherein the third transistor and the fourth transistor are turned on in response to the low write control signal, and wherein the source of the third transistor is coupled to the complementary bit line, the drain of the third transistor is grounded, the source of the fourth transistor is coupled to the power terminal, the drain of the fourth transistor is coupled to the complementary bit line, and the gate of the third transistor is connected to the gate of the fourth transistor and is coupled to the second AND gate; or
wherein the third transistor and the fourth transistor are turned on in response to the high write control signal, and wherein the drain of the third transistor is coupled to the complementary bit line, the source of the third transistor is grounded, the drain of the fourth transistor is coupled to the power terminal, the source of the fourth transistor is coupled to the complementary bit line, and the gate of the third transistor is connected to the gate of the fourth transistor and is coupled to the second AND gate.

10. The memory of claim 6, wherein the bank further comprises an isolation circuit; wherein the isolation circuit comprises a first switch transistor connected between the plurality of bit lines and the bit-line write circuit, and a second switch transistor connected between the complementary bit line and the complementary bit-line write circuit.

11. The memory of claim 10, wherein in response to the preset mode being a compression write mode, the isolation circuit is configured to turn on the first switch transistor and the second switch transistor; and in response to the preset mode being not the compression write mode, the isolation circuit is configured to turn off the first switch transistor and the second switch transistor.

12. The memory of claim 11, wherein a gate of the first switch transistor is connected to a gate of the second switch transistor and is coupled to an isolation signal terminal; wherein in response to the preset mode being the compression write mode, the isolation signal terminal is configured to output a high-level signal to the first switch transistor and the second switch transistor; and in response to the preset mode being not the compression write mode, the isolation signal terminal is configured to output a low-level signal to the first switch transistor and the second switch transistor.

13. A compression writing method, comprising:
controlling a memory to enter a preset mode;
activating each of a plurality of word lines in at least one target section comprised in the memory; and
pulling up or pulling down a level of each of a plurality of bit lines in the target section, and pulling a complementary bit line of each of the plurality of bit lines in the target section to a level opposite to a level of the plurality of bit lines,
wherein the memory comprises a bank, the bank comprises a plurality of sections, each of the plurality of sections comprises a plurality of word lines, a plurality of bit lines, and a plurality of storage units arranged in an array, wherein each of the plurality of storage units is connected to one of the plurality of word lines and one of the plurality of bit lines, and the complementary bit line is a bit line in a section adjacent to the target section.

14. The method of claim 13, wherein the activating each of the plurality of word lines in at least one target section comprised in the memory comprises:

receiving a control signal, wherein the control signal comprises a section enable signal; and
activating each of the plurality of word lines in the target section based on the section enable signal.

15. The method of claim 14, wherein the memory comprises a plurality of banks; and
the control signal further comprises a bank enable signal;
when the bank enable signal is enabled, each of the plurality of word lines in the target section is activated based on the section enable signal; and when the bank enable signal is disabled, no word line is activated.

16. The method of claim 15, wherein in the preset mode, a plurality of bank enable signals of the plurality of banks are enabled at the same time.

17. The method of claim 16, wherein the preset mode is a compression writing mode.

18. The method of claim 14, wherein the pulling up or pulling down the level of each of the plurality of bit lines in the target section comprises:
obtaining the section enable signal;
outputting a bit-line write control signal, wherein the bit-line write control signal is a high write control signal or a low write control signal; and
pulling up or pulling down the level of the plurality of bit lines based on the bit line write control signal.

19. The method of claim 14, wherein the pulling the complementary bit line to the level opposite to the level of the plurality of bit lines comprises:
obtaining the section enable signal;
outputting a complementary bit-line write control signal, wherein the complementary bit-line write control signal is a high write control signal or a low write control signal; and
pulling the complementary bit line to a level opposite to the level of the plurality of bit lines based on the complementary bit-line write control signal.

20. The method of claim 13, wherein the preset mode comprises a compression writing mode.

* * * * *